United States Patent

Ratzel et al.

(10) Patent No.: US 8,528,402 B2
(45) Date of Patent: Sep. 10, 2013

(54) MICROMECHANICAL COMPONENT HAVING A VOLUME-ELASTIC MEDIUM

(75) Inventors: Wolf-Ingo Ratzel, Stuttgart (DE); Christian Ohl, Pfullingen (DE); Juergen Kurle, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/402,626

(22) Filed: Feb. 22, 2012

(65) Prior Publication Data

US 2012/0144915 A1   Jun. 14, 2012

Related U.S. Application Data

(62) Division of application No. 12/270,087, filed on Nov. 13, 2008, now Pat. No. 8,148,187.

(30) Foreign Application Priority Data

Nov. 29, 2007   (DE) .......................... 10 2007 057 441

(51) Int. Cl.
*G01P 15/08*   (2006.01)
*G01L 7/00*    (2006.01)

(52) U.S. Cl.
USPC ................................. 73/493; 73/756

(58) Field of Classification Search
USPC .................... 73/493, 514.01, 514.14, 756
See application file for complete search history.

(56) References Cited

U.S. PATENT DOCUMENTS

| | | | |
|---|---|---|---|
| 4,750,364 A * | 6/1988 | Kawamura et al. | ............. 73/510 |
| 5,131,273 A * | 7/1992 | Tabata et al. | ............... 73/504.16 |
| 6,313,514 B1 | 11/2001 | Winterer et al. | |
| 6,435,028 B1 | 8/2002 | Nagahara | |
| 6,508,130 B2 | 1/2003 | Werner et al. | |
| 6,892,577 B2 | 5/2005 | Nagahara | |

FOREIGN PATENT DOCUMENTS

| | | |
|---|---|---|
| DE | 10226258 | 12/2003 |
| DE | 102004053782 | 5/2006 |

* cited by examiner

*Primary Examiner* — John Chapman, Jr.
(74) *Attorney, Agent, or Firm* — Kenyon & Kenyon LLP

(57) ABSTRACT

A method for manufacturing a micromechanical component is described, the micromechanical component having a medium. The medium has settable and changeable volume-elastic properties and generally completely encloses a sensor module and/or a module housing. The medium preferably has a low-pass response.

7 Claims, 1 Drawing Sheet

MICROMECHANICAL COMPONENT HAVING A VOLUME-ELASTIC MEDIUM

CROSS-REFERENCE TO RELATED APPLICATIONS

This application is a divisional of U.S. patent application Ser. No. 12/270,087 filed on Nov. 13, 2008 now U.S. Pat. No. 8,148,187, which claims priority to German Patent Application No. 10 2007 057 441.1 filed Nov. 29, 2007, all of which are incorporated herein by reference in their entirety.

CROSS REFERENCE

The present application claims the benefit under 35 U.S.C. §119 of German Patent No. 102007057441.1 filed on Nov. 29, 2007, which is expressly incorporated herein by reference in its entirety.

BACKGROUND INFORMATION

The present invention is directed to a micromechanical component. Conventional methods for manufacturing such micromechanical components are generally available. For example, a sensor is described in German Patent Application No. DE 102 26 258 A1, a sensor element of the sensor being protected by a protective layer. However, this sensor has the disadvantage that the protective layer is only partially provided over the sensor element. Areas of the sensor element not covered by the protective layer can therefore be easily damaged.

SUMMARY

A method according to an example embodiment of the present invention for manufacturing a micromechanical component may have the advantage that protection of the sensor module, for example, from mechanical stresses, is achieved using the medium, and the sensor module is concurrently fastened within the external housing by the medium without additional mounting steps. In addition, a frequency filter may be formed by the medium, so that generally only selected frequencies reach the sensor module in the micromechanical component. Complex fastening mechanisms which fix the sensor module in the external housing and may be damaged during the service life of the sensor module, for example, may thus also be advantageously dispensed with. Furthermore, the medium produces a comprehensive protection of the sensor module from externally acting substances, such as conductive and/or etching liquids.

The sensor module and/or the module housing is/are generally completely enclosed by the medium; however, an access to the sensor module and/or the module housing may be shaped intentionally through the medium. Such an access may be provided if the micromechanical element is used as a pressure sensor, for example.

A volume-elastic medium may be understood as a foam-like elastomer which may change its volume in an elastically reversible way to a larger extent under changing, external mechanical-thermal stresses than compact sealing compounds, for example. For example, the volume of the medium is to be changeable by approximately 5% to 80%, preferably approximately 10% to 30% during the manufacturing of the micromechanical component. If the sensor module is enclosed by the medium, the medium thus additionally advantageously protects the sensor module during a subsequent injection-molding process to produce the external housing. The pressure arising due to the injection-molding method is advantageously absorbed by the medium and does not result in damage to the sensor module. In the finished manufactured micromechanical component, pre-tensioning of the medium is also preferably caused by the enclosure of the medium inside the external housing. This pre-tension preferably continues to exist throughout the entire service life of the micromechanical component and thus ensures that the sensor module remains permanently enclosed by the medium even in the event of changing ambient temperatures. With regard to the volume-elastic medium, reference is made to the volume-compressible medium in German Patent Application No. DE 10 2004 053 782 A1, which is expressly incorporated herein by reference in its entirety.

The medium particularly preferably is constructed as a frequency filter through the selection of the material properties of the medium and/or through the selection of manufacturing parameters during the manufacturing of the micromechanical component. Thus, the transmission function of the micromechanical component may be varied (set) advantageously by special material properties of the medium—for example, its elasticity or its damping properties—and, for example, the selection of the distance between the sensor module and the external housing or the module housing to the external housing. For example, a mechanical low-pass response having a limiting frequency in the range of approximately 100 Hz to 2 kHz, for example, may thus be achieved for a micromechanical component. Furthermore, the material properties of the medium may be changed during the manufacturing by an appropriate selection of the manufacturing parameters, so that corresponding frequencies may thus also be filtered.

The sensor module is preferably fastened by the medium in a module housing and/or the module housing is fastened by the medium in the external housing. As already noted, additional fasteners for fixing the sensor module in the module housing and/or the module housing in the external housing or the sensor module in the external housing may thus advantageously be dispensed with. In addition, a protection from mechanical and/or thermal-mechanical stresses and/or from externally acting substances is advantageously provided by the medium for both the module housing and also the sensor module. If a sensor module is used, which is fastened in the module housing by the medium, the module housing being fastened in the external housing by the medium, the sensor module is therefore protected particularly reliably, because both the module housing and also the medium are provided as the protection.

The medium preferably includes a first medium and a second medium, the first medium and the second medium preferably having different chemical and/or physical properties. Particularly preferably, the sensor module is enclosed in the module housing by the first medium and the module housing is enclosed in the external housing by the second medium. The different functions of the medium (fastening, protection, frequency filter) may thus advantageously also be fulfilled by two media having different chemical and/or physical properties, whereby the functions may be fulfilled with greater decoupling.

In the context of the present invention, one medium is referred to, even if this is to be understood to mean a first medium and a second medium. The properties or embodiments of the medium may relate to both the first medium and also the second medium or only the first medium or the second medium. At least the first medium and/or the second medium is/are provided as volume-elastic, reference being made to the definition already given in regard to the term "volume-elastic."

The viscosity of the medium preferably rises during the manufacturing of the micromechanical component, for example, by chemical cross-linking. The medium preferably changes during the manufacturing of the micromechanical component from a medium having flow properties to a medium having solid properties. Particularly sensitive structures may thus particularly advantageously be prevented from being damaged by the medium during the initial enclosure. Nonetheless, secure fastening of the sensor module and/or the module housing is achieved by the solid properties of the medium. For example, a medium may be used which initially has low viscosity flow properties during the embedding and/or enclosure of the sensor module, but then exhibits an increase in the viscosity until it becomes a cross-linked solid. In particular two-component or multi-component polymers having an elastomer carrier are preferably to be used as the medium for this purpose. In particular an elastomer foam, for example, made of polyurethane or a so-called liquid silicone rubber may preferably be used as an elastomer for this purpose.

The medium is preferably pre-tensioned during the manufacturing of the micromechanical component during or by a preferably subsequent enclosure by the external housing. The micromechanical component, specifically its electrical supply lines, is under a slight residual pressure due to the pre-tensioning, even in the event of various environmental conditions of the micromechanical component. An outward seal of the electrical supply lines is ensured in this way even in the event of differing ambient conditions (in particular temperature changes). A possible liquid entry into the micromechanical component because of pumping effects may thus advantageously be generally reliably prevented. The pre-tensioning of the medium may particularly preferably be performed in that the medium has elements whose volumes change particularly greatly—beyond the volume compressibility of a solid—in the event of corresponding ambient temperatures and/or by chemical processes during the manufacturing, for example. The medium is preferably also reversibly volume-elastic after the manufacturing.

Internal, closed-cell bubbles are particularly preferably produced in a precursor stage of the medium and/or admixed in a precursor stage of the medium as such elements in the manufacturing method. Initially the bubbles are preferably liquid-filled. The bubble count and/or the bubble size during the manufacturing is/are particularly preferably dimensioned in such a way that the space filled up by the medium inside the micromechanical component is pre-tensioned when the medium is enclosed by the external housing. The bubbles represent small gas springs. Alternatively or additionally, the medium may have elastic, generally hollow microbeads as such elements. Closed-cell bubbles whose liquid is already irreversibly vaporized before the admixing in the precursor stage of the medium are particularly preferably used as microbeads. These bubbles generally no longer change their volume after the admixing. The bubbles are particularly preferably mixed into an elastomer.

The bubbles preferably change as a function of the manufacturing parameters. A change in the bubbles is to be understood as an expansion or a shrinkage of the bubbles. The later pre-tensioning of the medium may be influenced during the manufacturing process by the count and/or the size of the bubbles and/or the microbeads. If an elastomer is used, for example, the cross-linking rate of the elastomer may be influenced via the supplied heat as a manufacturing parameter.

The expansion of the bubbles within the elastomer may in turn be intentionally influenced by the cross-linking rate. It should be clear that the bubbles may not expand in an elastomer which already has solid properties. Therefore the bubbles preferably initially expand up to a predefined volume before the elastomer cross-links generally completely. Of course, both processes may also run simultaneously, the bubble expansion being stopped upon a corresponding degree of cross-linking of the elastomer. The expansion of the bubbles is additionally a function of the processing temperature, the pressure which acts on the medium during the manufacturing, and/or a high-energy irradiation of the medium during the manufacturing. The bubbles particularly preferably have a liquid during the manufacturing, the liquid vaporizing within the bubbles—for example, at an increase in the processing temperature—within the bubble envelope. The resulting gas and/or vapor mixture remains within the bubble envelope, by which the bubble is inflated. Therefore the bubbles inflate preferably irreversibly. After a subsequent enclosure of the sensor module and/or the module housing by the external housing, advantageously no intermediate spaces and/or cavities thus result between the sensor module and the module housing and/or the module housing and the external housing or the sensor module and the external housing except for the bubbles. Without intermediate spaces and with appropriate pre-tensioning, the penetration of substances (such as liquids) within the micromechanical component is prevented, by which the sensor module is protected from such substances.

The sensor module is preferably embedded in the medium. Furthermore, the module housing is preferably embedded in the medium. Of course, it is also possible that first the sensor module is embedded in the medium, the embedded sensor module is received by the module housing, and then the module housing is embedded in the medium, before the embedded module housing (having the embedded sensor module) is received by the external housing. The medium is advantageously processed particularly simply and cost-effectively by the embedding.

Furthermore, the sensor module enclosed by the medium or the module housing enclosed by the medium is preferably extrusion-coated and/or embedded to form the external housing. The formation of the external housing by extrusion-coating or embedding is advantageously simple and particularly cost-effective.

In another preferred specific embodiment, the sensor module or the module housing (having a medium between the module housing and the sensor module or having the sensor module without a medium) is positioned in the external housing and then embedded in the medium. Of course, the sensor module may also be positioned inside the module housing and subsequently embedded in the medium. The external housing is preferably manufactured by an injection-molding method before the introduction of the medium.

In a preferred specific embodiment, the medium at least partially has a protective layer. The protective layer may preferably be formed from the medium itself and act as a mechanical protection from mechanical stresses and/or as a repellent barrier against externally acting substances, for example. The sensor module is advantageously additionally protected by the protective layer, by which the service life of the sensor module may advantageously be increased. Of course, the protective layer may be implemented around both a sensor module enclosed by a medium and also around a module housing enclosed by a medium.

The protective layer preferably arises in that the bubbles within the medium generally do not expand in the boundary area of the medium. The medium is less volume-elastic in the boundary area due to the generally unexpanded bubbles, because the solid properties of the elastomer predominate. Expansion of the bubbles in the boundary area may be prevented, for example, in that the elastomer cross-links more rapidly in the boundary area.

A further example embodiment of the present invention is a micromechanical component, the micromechanical component being manufactured according to the method described above. The micromechanical component has a sensor module and/or module housing generally completely enclosed by the medium, the medium having a frequency filtering response. Accordingly, frequencies may be selectively filtered by the properties of the medium, the filter action of the medium being a function of the material properties and/or the processing parameters of the medium. The medium particularly preferably acts as a low-pass filter.

The medium preferably includes a first medium and a second medium, the first medium having different chemical and/or physical properties than the second medium. The sensor module is particularly preferably generally completely enclosed in the module housing by the first medium and the module housing is generally completely enclosed in the external housing by the second medium. Preferably, only the first medium or the second medium acts as a frequency filter and the other medium is used for fastening the sensor module or the module housing within the external housing.

The medium preferably has bubbles within the micromechanical component. The first medium and/or the second medium particularly preferably has/have bubbles.

Furthermore, there are preferably generally no cavities and/or intermediate spaces present due to the medium between the sensor module and the module housing and/or between the module housing and the external housing or between the sensor module and the external housing. The first medium and/or the second medium thus fills/fill up generally all intermediate spaces between the sensor module and the module housing and/or between the module housing and the external housing or between the sensor module and the external housing. The sensor module and/or the module housing may thus advantageously be fixed by the medium in its position within the external housing.

The micromechanical component is used, for example, as a pressure sensor or as an acceleration sensor.

BRIEF DESCRIPTION OF THE DRAWINGS

Exemplary embodiments of the present invention are illustrated in the figures and are explained in greater detail below.

DETAILED DESCRIPTION OF EXAMPLE EMBODIMENTS

Figure 1:
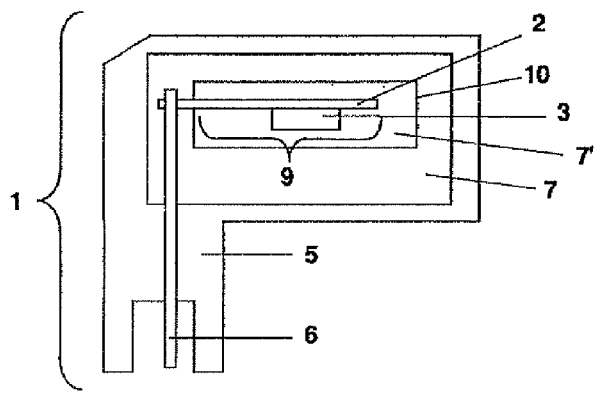
FIG. 1 schematically shows a micromechanical component having a medium.

FIG. 1 schematically shows a micromechanical component 1, micromechanical component 1 having a sensor module 9, a module housing 10, a medium, and an external housing 5. The medium includes a first medium 7' and a second medium 7 in the exemplary embodiment, medium 7, 7' also being referred to in the following description. Sensor module 9 has a circuit board 2, a sensor chip 3, and at least one terminal pin 6 in the exemplary embodiment. It is possible to contact sensor chip 3 using terminal pin 6. First medium 7' encloses sensor module 9 in the exemplary embodiment, second medium 7 enclosing module housing 10. Generally no free spaces (intermediate spaces) result between module housing 10 and external housing 5 or between sensor module 9 and module housing 10 due to first and second medium 7', 7 (with the exception of bubbles 11 inside medium 7, 7' if medium 7, 7' has bubbles). Module housing 10 and also sensor module 9 are fixed by medium 7, 7' within external housing 5. Complex fastening devices are thus not necessary. Because first and second medium 7, 7' have volume-elastic properties, module housing 10 and/or sensor module 9 is/are protected from mechanical stresses, for example, by medium 7, 7'. For example, sensor module 9 or module housing 10 may be extrusion-coated to form external housing 5, without the arising pressures damaging sensor module 9 or module housing 10. Medium 7, 7' thus acts as a cushion in this case. Medium 7, 7' is preferably pre-tensioned after being enclosed by external housing 5, whereby no intermediate spaces arise between sensor module 9 and/or the module housing and external housing 5. A pumping action is thus prevented, whereby no liquids are sucked into external housing 5.

Figure 2:
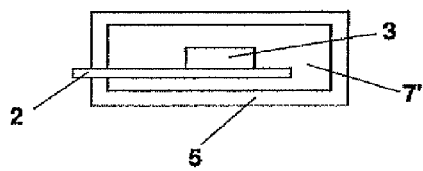
FIG. 2 schematically shows a micromechanical component without a module housing.

FIG. 2 schematically shows sensor module 9 without module housing 10 in micromechanical component 1. In this case, sensor module 9 is only held in external housing 5 by first medium 7'. First medium 7' is advantageously sufficient here as protection of sensor module 9 against, for example, mechanical stresses (for example, during the injection-molding method for manufacturing external housing 5). One component (module housing 10) fewer is advantageously needed for manufacturing micromechanical component 1, by which the manufacturing process may be shortened and simplified, the manufacturing costs may be reduced, and the weight of micromechanical component 1 may be decreased. A plurality of sensor chips 3 may be placed in a composite within the external housing 5, for example. In this case, sensor chips 3 may be contacted, for example, by wire bonds and/or via isotropic or anisotropic glued bonds and/or via a flip chip mounting on metallic contact elements of external housing 5.

Figure 3:
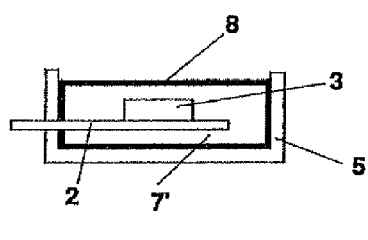
FIG. 3 schematically shows a micromechanical component having a medium, the medium having a protective layer.

FIG. 3 schematically shows micromechanical component 1, first medium 7' in the exemplary embodiment having a protective layer 8 as an envelope and/or external skin of first medium 7'. Protective layer 8 is preferably used for increased mechanical protection or as an external terminus of external housing 5. In this case, it is therefore not necessary for external housing 5 to completely enclose sensor module 9. Protective layer 8 may preferably additionally be altered during or after the manufacturing process—for example, chemically and/or mechanically—in such a way that it forms a barrier against etching and/or conductive substances, for example. Protective layer 8 preferably arises in that bubbles 11 generally do not expand within protective layer 8.

Figure 4:
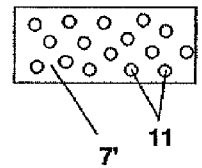
FIG. 4 schematically shows the medium having bubbles.

FIG. 4 schematically shows a possible embodiment of first medium 7'. First medium 7' has bubbles 11 in the exemplary embodiment. The bubbles are preferably added to an elastomer as a further component during the manufacturing of micromechanical component 1, the bubbles being liquid-filled at this time and having a size of approximately 2 $\mu$m to 40 $\mu$m, particularly preferably approximately 10 $\mu$m to 20 $\mu$m. The liquid vaporizes within the bubbles by increasing the processing temperature, for example, the resulting vapor or gas remaining inside the bubbles. The bubbles thus inflate generally irreversibly, so that they reach a size of approximately 30 $\mu$m to 80 $\mu$m, preferably approximately 50 $\mu$m. Medium 7, 7' resulting due to the elastomer and the bubbles is distinguished by an generally homogeneous bubble size (except in the area of protective layer 8). The bubble size and the bubble count may be set reproducibly during the manufacturing process. Medium 7, 7' may thus be adapted optimally to the functions of medium 7, 7' by bubbles 11 and through the processing and the selection of the elastomer. It is therefore possible to reproduce, set, and vary the volume-elastic properties of medium 7, 7' in an advantageous manner. The frequency filtering properties of medium 7, 7' thus also become reproducible and settable.

What is claimed is:

1. A micromechanical component, comprising:
   a housing;
   a sensor module positioned in the housing; and
   a volume-elastic medium enclosing completely the sensor, the medium having a frequency filtering response, and the medium being pre-tensioned.

2. The micromechanical component as recited in claim 1, wherein the medium comprises a first medium and a second medium, the first medium having at least one of different chemical properties or different physical properties, than the second medium.

3. The micromechanical component as recited in claim 2, wherein at least one of the first medium and the second medium have bubbles.

4. The micromechanical component as recited in claim 1, wherein the medium fills up all intermediate spaces between the sensor module and the external housing in the micromechanical component.

5. The micromechanical component as recited in claim 1, wherein the sensor is a pressure sensor.

6. The micromechanical component as recited in claim 1, wherein the sensor is an acceleration sensor.

7. A micromechanical component, comprising:
   an external housing;
   a sensor module;
   a module housing enclosing the sensor module, the module housing being positioned in the external housing; and
   a volume-elastic medium completely enclosing the module housing, the medium having a frequency filtering response, and the medium being pre-tensioned.

\* \* \* \* \*